(12) United States Patent
Hu et al.

(10) Patent No.: US 7,279,796 B2
(45) Date of Patent: Oct. 9, 2007

(54) MICROELECTRONIC DIE HAVING A THERMOELECTRIC MODULE

(75) Inventors: Chuan Hu, Chandler, AZ (US); Gregory M. Chrysler, Chandler, AZ (US); Ravi V. Mahajan, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 380 days.

(21) Appl. No.: 10/638,038

(22) Filed: Aug. 8, 2003

(65) Prior Publication Data

US 2005/0029637 A1 Feb. 10, 2005

(51) Int. Cl.
  *H01L 23/48* (2006.01)
  *H01L 23/52* (2006.01)
  *H01L 29/40* (2006.01)

(52) U.S. Cl. .................. 257/778; 257/712; 257/720

(58) Field of Classification Search ............... 257/778, 257/758, 706, 712, 737, 738, 704, 675, 720, 257/724, 730–731, 773, 774, 786, 796, E21.503, 257/E33.075, E31.131, E23.051, E23.08
See application file for complete search history.

(56) References Cited

U.S. PATENT DOCUMENTS

| | | | | |
|---|---|---|---|---|
| 5,870,289 A | * | 2/1999 | Tokuda et al. | 361/779 |
| 6,094,919 A | * | 8/2000 | Bhatia | 62/3.7 |
| 6,803,659 B2 | * | 10/2004 | Suwa et al. | 257/738 |
| 6,893,523 B2 | * | 5/2005 | Gaynes et al. | 156/153 |
| 2004/0118129 A1 | * | 6/2004 | Chrysler et al. | 62/3.2 |

* cited by examiner

*Primary Examiner*—Hoai Pham
*Assistant Examiner*—Dilinh Nguyen
(74) *Attorney, Agent, or Firm*—Blakely, Sokoloff, Taylor & Zafman LLP

(57) ABSTRACT

A microelectronic die is provided having an integrated thermoelectric module. The microelectronic die has a die substrate, a microelectronic circuit formed on a front side of the die substrate, and the thermoelectric module on a backside of the die substrate. Vias in the substrate interconnect the thermoelectric module with power and ground planes on the front side of the die substrate.

9 Claims, 4 Drawing Sheets

US 7,279,796 B2

MICROELECTRONIC DIE HAVING A THERMOELECTRIC MODULE

BACKGROUND OF THE INVENTION

1). Field of the Invention

This invention relates to a microelectronic die having a thermoelectric module and to an electronic assembly which includes such a microelectronic die.

2). Discussion of Related Art

Microelectronic circuits are usually formed in rows and columns over a silicon or other semiconductor wafer substrate. The silicon substrate is subsequently "singulated" or "diced" by directing a blade of a saw in x- and y-directions between the dies to separate the dies from one another. Such a die is then typically mounted to a carrier substrate for purposes of providing rigidity to the die and to provide signals, power, and ground to the die.

In certain applications, the microelectronic circuit is formed on a front side of the die, and solder balls or other conductive members are formed on the front side of the die. Such a die is located with the front side thereof facing the carrier substrate, and attached to the carrier substrate in a thermal reflow process. A thermally conductive plate of an integrated heat spreader or a heat sink is then located against a back side of the die with a thermal interface material coupling the back side of the die to the thermally conductive plate. The purpose of the thermally conductive plate is to provide a path through which heat can conduct from the die.

Passive cooling with heat sinks and thermally conductive plates no longer provides sufficient cooling because (a) the magnitude of power generated by microelectronic circuits of some dies has become so high; (b) power density of some areas of a die has become very high; and (c) a thermally conductive plate is relatively far from the microelectronic circuits, so that a thermal resistance and/or a thermal spreading resistance are created by silicon and other materials between the microelectronic circuit and the thermal conductive plate. Existing cooling solutions furthermore do not provide the capability of localized cooling of hot spots of a die. Thus, an active, refrigeration-based cooling may be required.

BRIEF DESCRIPTION OF THE DRAWINGS

The invention is described by way of example with reference to the accompanying drawings, wherein.

DETAILED DESCRIPTION OF THE INVENTION

A microelectronic die is provided having an integrated thermoelectric module. The microelectronic die has a die substrate, a microelectronic circuit formed on a front side of the die substrate, and the thermoelectric module on a backside of the die substrate. Vias in the substrate interconnect the thermoelectric module with power and ground planes on the front side of the die substrate.

Figure 1:
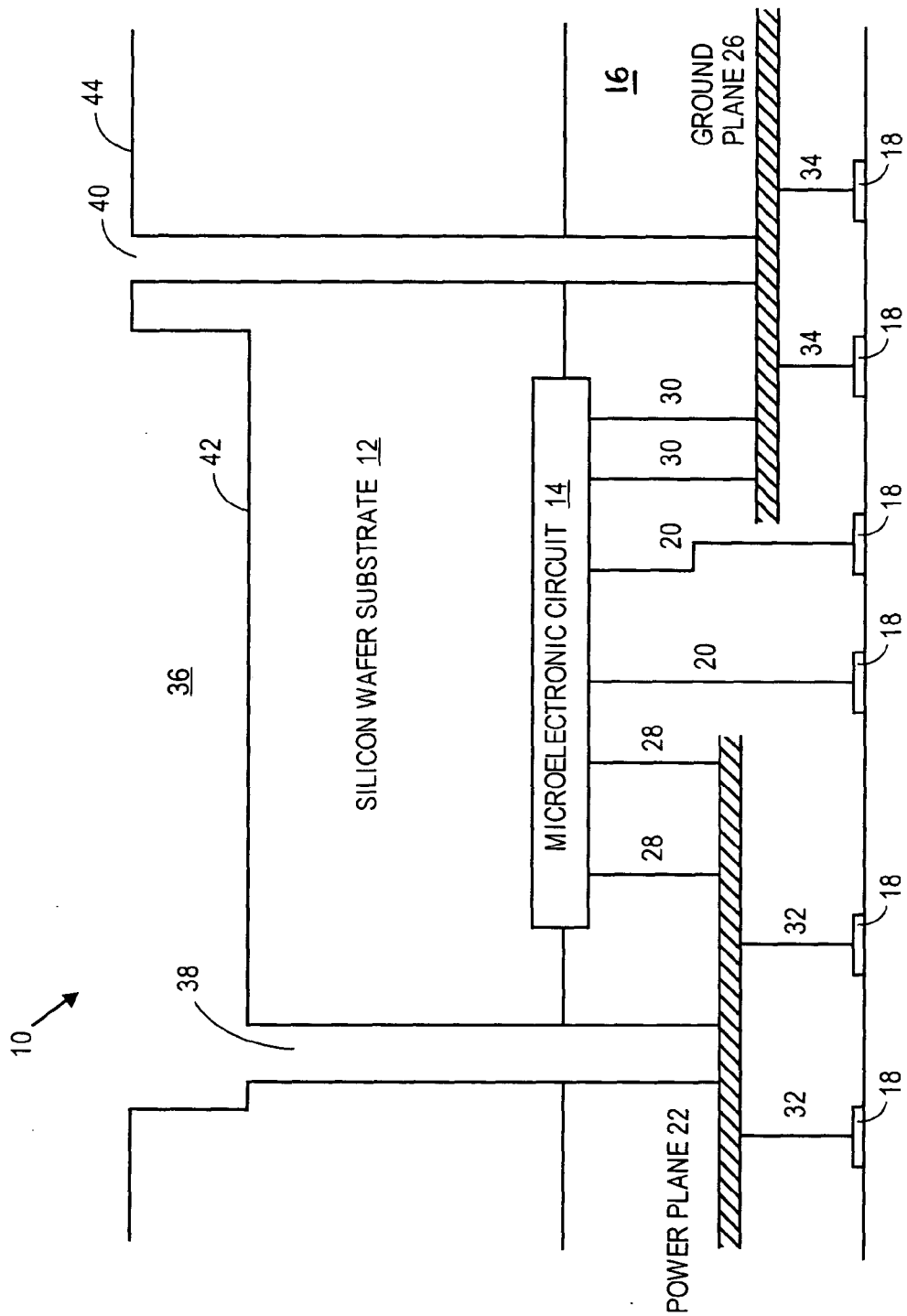
FIG. 1 is a cross-sectional side view illustrating partial fabrication of a microelectronic die, according to an embodiment of the invention, at wafer level.

FIG. 1 of the accompanying drawings illustrates a portion of a microelectronic die 10 which is partially processed in a wafer before the wafer is singulated. Components of the unsingulated microelectronic die 10 are formed on a silicon wafer substrate 12 which, after singulation, forms a die substrate of the singulated die.

A microelectronic circuit 14 is formed in and on the silicon wafer substrate 12. The microelectronic circuit 14 includes a large number, typically millions, of electronic components such as transistors, capacitors, diodes, etc. The manufacture of such electronic components on a silicon wafer substrate is known in the art.

Interconnect layers, generally referred with reference numeral 16, are subsequently formed on the microelectronic circuit 14. The interconnect layers 16 include alternating metal and dielectric layers. The metal layers are patterned to obtain a predetermined circuit layout. Vias are also formed in the dielectric layers and interconnect metal lines of the different metal layers. The metal lines and vias interconnect components of the microelectronic circuit 14 to complete the microelectronic circuit 14. The metal lines and vias also connect the microelectronic circuit 14 electrically to bond pads 18. Electric links 20 are so established between the microelectronic circuit 14 and some of the bond pads 18.

The metal layers of the interconnect layers 16 further include a power plane 22, and a ground plane 26. The power and ground planes 22 and 26 are at different elevations, and may even be partially adjacent and parallel to one another. Circuit-power links 28 are also established between the microelectronic circuit 14 and the power plane 22. Circuit-ground links 30 connect the microelectronic circuit 14 to the ground plane 26. Power plane-pad links 32 interconnect the power plane 22 with one or more of the bond pads 18, while ground plane-pad links 34 interconnect the ground plane 26 with further ones of the bond pads 18. Power can thus be provided to the microelectronic circuit 14 through some of the bond pads 18, the power plane-pad links 32, the power plane 22, and the circuit-power links 28. Similarly, ground can be provided to the microelectronic circuit 14 through some of the bond pads 18, the ground plane-pad links 34, the ground plane 26, and some of the circuit-ground links 30.

All the processing heretofore described is carried out with a side of the silicon wafer substrate 12 having the microelectronic circuit 14 at the top. The silicon wafer substrate 12 is then flipped over and a recess 36 is formed in a side thereof opposing the microelectronic circuit 14. The recess 36 may be between five and 10 microns deep, and may be made utilizing commonly known photolithographic or other techniques. Power and ground via openings 38 and 40 are subsequently formed from a side of the silicon wafer substrate 12 having the recess 36 up to the power and ground planes 22 and 26, respectively. The via openings 38 and 40 may, for example, be laser-drilled or wet or dry etched. In the present example, the power via opening 38 is formed into a base 42 of the recess 36, while the ground via opening 40 is formed from a surface 44 of the silicon wafer substrate 12 adjacent to the recess 36. The via openings 38 and 40 both bypass the electric components of the microelectronic circuit 14.

Figure 2:
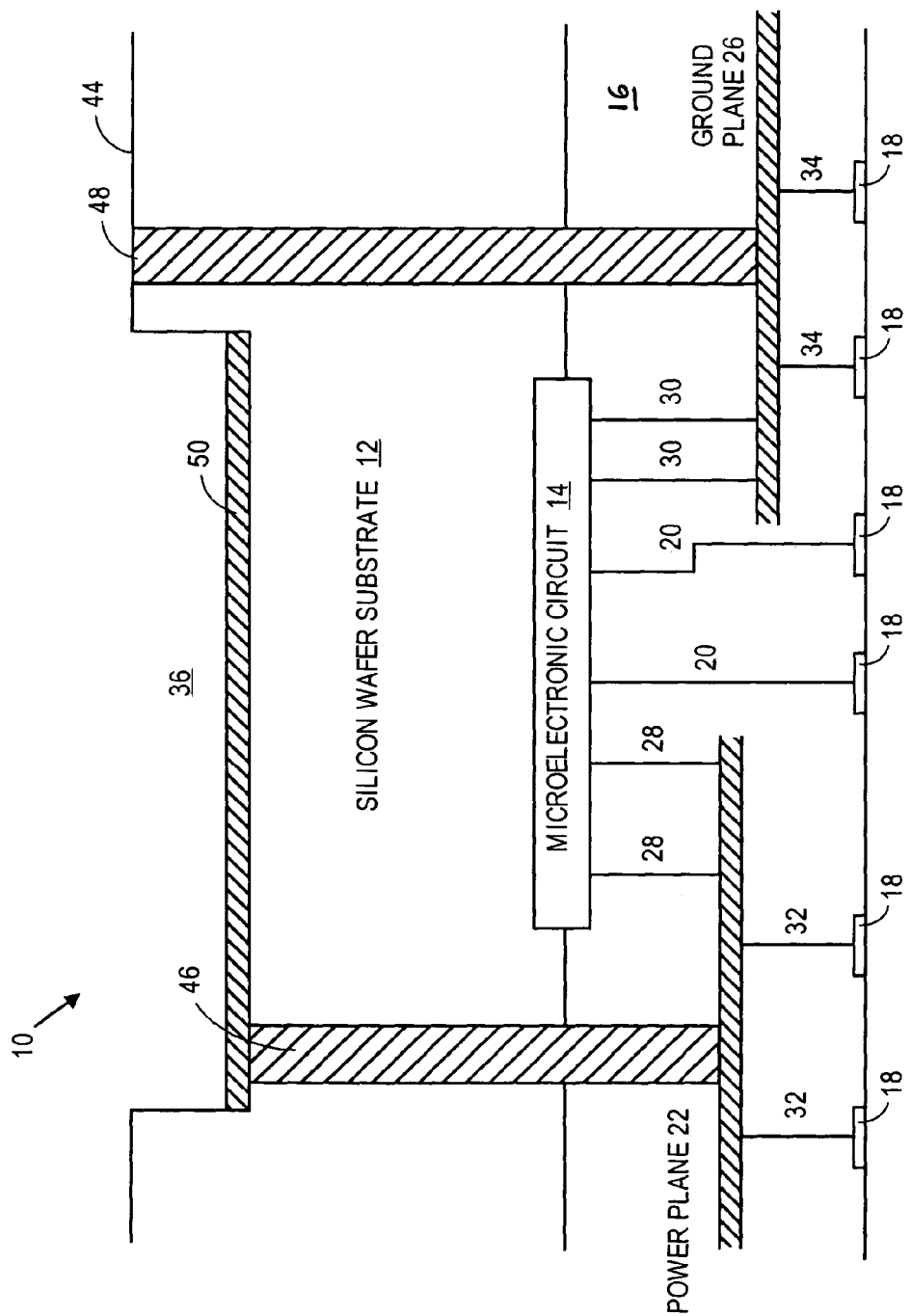
FIG. 2 is a view similar to FIG. 1 after a power via and a metal conductor pad are formed to provide power to a thermoelectric module, and a ground via is formed.

When comparing FIG. 2 with FIG. 1, it can be seen that the power and ground via openings 38 and 40 of FIG. 1 are subsequently filled in FIG. 2 with power and ground vias 46 and 48, respectively. The power via 46 extends from the power plane 22 to the base 42 of the recess 36. The ground via 48 extends from the ground plane 26 to the surface 44 of the silicon wafer substrate 12. As further illustrated in FIG. 2, a metal conductor pad 50 is then formed on the base 42 of the recess 36. A portion of the metal conductor pad 50 is also formed on an end of the power via 46. The metal conductor pad 50 is so connected through the power via 46 to the power plane 22.

Figure 3:
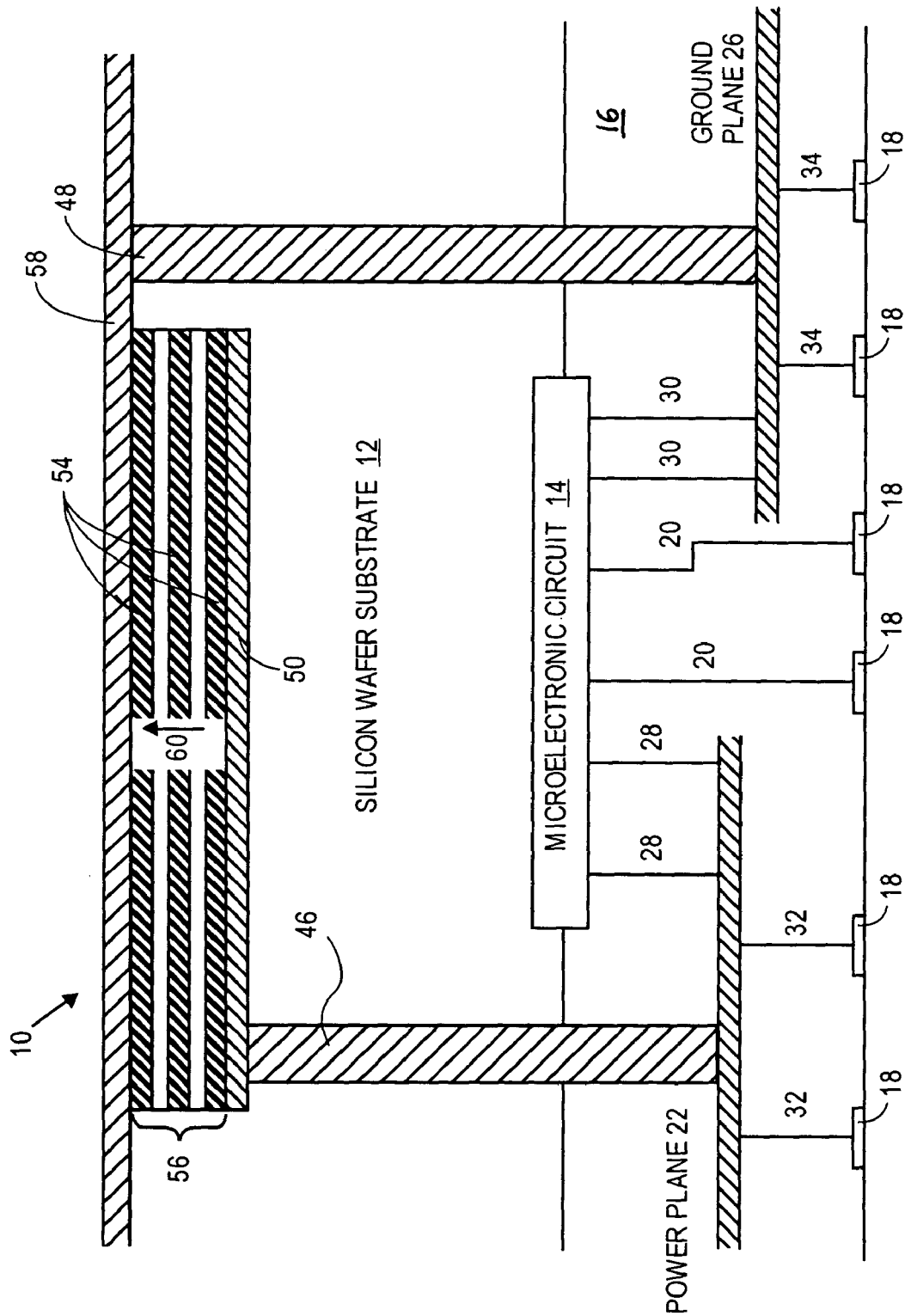
FIG. 3 is a view similar to FIG. 2 after fabrication of a thermoelectric module and a backside metallization layer or structure to provide ground to the thermoelectric module.

As illustrated in FIG. 3, a plurality of layers of thermoelectric material 54 are formed on and subsequently above the metal conductor pad 50. The layers of thermoelectric material 54 may be fabricated utilizing molecular beam epitaxy or other methods. The layer of thermoelectric material 54 make up a thermoelectric module 56. Either p- or n-type thermoelectric materials may be used for the layers 54. In the present example, where the metal conductor pad 50 is connected to power, the layers of thermoelectric material 54 are all chosen to be of n-type thermoelectric material. P-type thermoelectric material may be used in an embodiment where the metal conductor 50 is connected to ground.

As further illustrated in FIG. 3, a backside metallization layer 58 is formed on a final one of the layers of thermoelectric material 54. A portion of the backside metallization layer 58 is also formed on the ground via 48. The upper one of the layers of thermoelectric material 54 is connected through the backside metallization layer 58, and the ground via 48 to ground. When power is provided to the power plane 22 of the microelectronic die 10, current can flow through the layers of thermoelectric material 54 in a direction 60 away from the microelectronic circuit 14.

Figure 4:
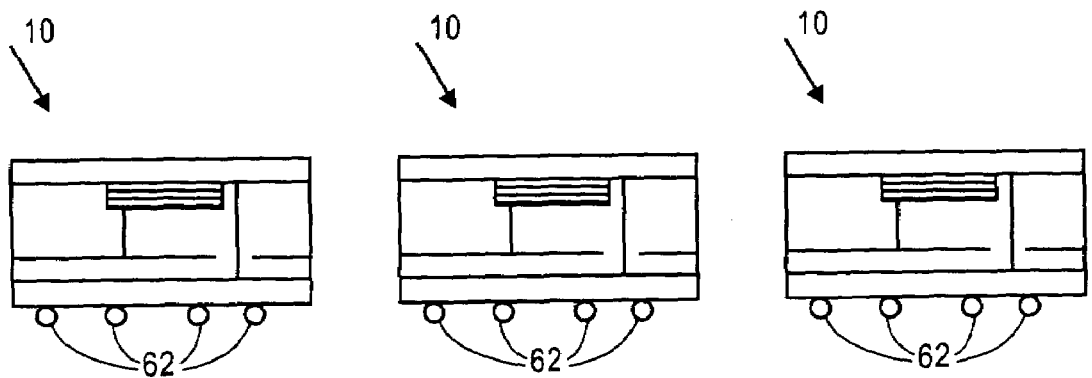
FIG. 4 is a cross-sectional side view of singulated dies, each having at least one of the thermoelectric modules receiving power from a front side of the die.

Referring to FIG. 4, a plurality of dies 10, identical to the die 10 illustrated in FIG. 3, are formed on a wafer substrate. A top plan view would show that dies are replicated in rows and columns across a circular wafer substrate. Solder balls 62 or other conductive members are plated on each one of the bond pads 18 of FIG. 3. The dies 10 are separated from one another by directing a blade of a saw in x- and y-directions horizontally through the silicon wafer substrate 12 and the layers formed on both sides thereof.

Figure 5:
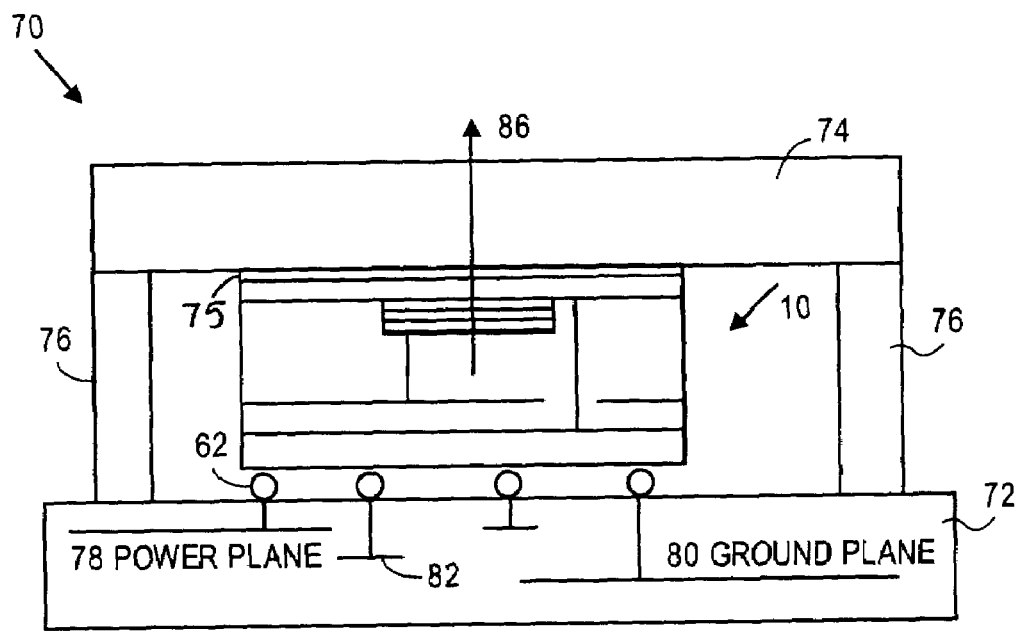
FIG. 5 is a cross-sectional side view of an electronic assembly that includes one of the dies, also according to an embodiment of the invention.

FIG. 5 illustrates an electronic assembly 70 that includes one of the microelectronic dies 10, and further includes a carrier substrate in the form of a printed circuit board 72, a thermally conductive plate 74, a thermal interface material 75, and a sealant 76. The solder balls 62 are placed on terminals (not shown) of the printed circuit board 72 and soldered thereto in a thermal reflow process. The printed circuit board 72 also includes a power plane 78, a ground plane 80, and other metal lines 82. The power plane 78 is connected to one or more of the solder balls 62 providing power to the microelectronic die 10, while the ground plane 80 is connected to one or more of the solder balls 62 providing ground to the microelectronic die 10, and the other metal lines 82 are connected to further ones of the solder balls 62 providing signals to and from the microelectronic die 10.

The thermally conductive plate 74 is positioned on top of the microelectronic die 10. A thermal interface material (not shown) is located between the microelectronic die 10 and the thermally conductive plate 74, for purposes of coupling the microelectronic die 10 thermally to the thermally conductive plate 74. The sealant 76 is located around the microelectronic die 10 and between upper and lower surfaces of the printed circuit board 72 and the thermally conductive plate 74, respectively.

When power is provided through the power plane 78, current flows in a direction 60 (FIG. 3) through the thermoelectric module 56. Because n-type thermoelectric material is used, heat is pumped in a direction 86 (FIG. 5), which is the same as the direction 60. The heat conducts to the thermally conductive plate 74, from where it can be conducted or convected away. Should a p-type thermoelectric material be used, the structure would be changed so that the current flows in a direction opposite to the direction 60, but heat is still pumped in the direction 86. It may also be possible to use both p- and n-type thermoelectric materials, but then an extra step of metallization to wire p- and n-type independently may be required.

It can thus be seen that a thermal electric cooler is provided in the form of the thermoelectric module 56, which is also aligned with a microelectronic circuit 14. The thermal electric cooler can be located over the whole die as indicated, or may cover only a part of the die where, for example, hot spots occur. It may also be possible to form more than one thermal electric cooler on the backside of one die. In such an embodiment, the thermal electric coolers can be connected in parallel to power and ground planes, utilizing the process illustrated in FIGS. 1, 2, and 3.

What should also be noted that the microelectronic die 10 has a flat backside, with the thermoelectric module integrated therein. A flat backside can enable the integration of thinner thermal interface materials and lower the thermal resistance.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A microelectronic die, comprising:
   a die substrate;
   a microelectronic circuit formed on a front side of the die substrate;
   a thermoelectric module on a back side of the die substrate; and
   vias in the die substrate electrically interconnecting electric terminals of the thermoelectric module with power or ground conductors on the front side of the die substrate for providing current to the thermoelectric module.

2. The microelectronic die of claim 1, wherein the power and ground conductors are power and ground planes providing power and ground, respectively, to the microelectronic circuit and to the thermoelectric module.

3. The microelectronic die of claim 1, further comprising:
   a plurality of electrically conductive interconnection members attached on a side of the conductors opposing the die substrate, providing at least signals to and from the microelectronic circuit.

4. The microelectronic die of claim 3, wherein the electrically conductive interconnection members provide power and ground to the power and ground conductors, respectively.

5. An electronic assembly, comprising:

a carrier substrate;

a microelectronic die mounted on the carrier substrate, the microelectronic die including a die substrate, a microelectronic circuit formed on a front side of the die substrate, a thermoelectric module on a back side of the die substrate, and vias in the die substrate electrically interconnecting electric terminals of the thermoelectric module with power or ground conductors on the front side of the die substrate for providing current to the thermoelectric module.

6. The electronic assembly of claim 5, wherein the microelectronic die further includes a plurality of electrically conductive interconnection members between the microelectronic circuit and the carrier substrate, providing at least signals between the carrier substrate and the microelectronic circuit.

7. The electronic assembly of claim 6, wherein the thermoelectric module is on a side of the die substrate opposing the carrier substrate.

8. The electronic assembly of claim 7, further comprising:

a thermally conductive plate thermally coupled to the thermoelectric module.

9. The electronic assembly of claim 8, further comprising:

a thermal interface material between the microelectronic die and the thermally conductive plate, the thermal interface material thermally coupling the thermoelectric module to the thermally conductive plate.

* * * * *